(12) United States Patent
John et al.

(10) Patent No.: US 8,227,331 B2
(45) Date of Patent: Jul. 24, 2012

(54) METHOD FOR DEPOSITING A SOLDER MATERIAL ON A SUBSTRATE

(75) Inventors: Joachim John, Freiburg (DE); Lars Zimmerman, Meiningen (DE)

(73) Assignee: IMEC, Leuven (BE)

( * ) Notice: Subject to any disclaimer, the term of this patent is extended or adjusted under 35 U.S.C. 154(b) by 858 days.

(21) Appl. No.: 11/069,219

(22) Filed: Feb. 28, 2005

(65) Prior Publication Data

US 2005/0227413 A1    Oct. 13, 2005

Related U.S. Application Data

(60) Provisional application No. 60/549,216, filed on Mar. 1, 2004.

(30) Foreign Application Priority Data

Mar. 4, 2004   (EP) ..................................... 04447054

(51) Int. Cl.
*H01L 21/44* (2006.01)
(52) U.S. Cl. ......... 438/612; 257/E21.257; 257/E21.508; 257/E21.509
(58) Field of Classification Search .................. 438/612, 438/613, 667
See application file for complete search history.

(56) References Cited

U.S. PATENT DOCUMENTS

| 3,343,256 A * | 9/1967 | Smith et al. .................... 438/565 |
| 3,372,070 A * | 3/1968 | Zuk ................................ 438/504 |
| 3,372,090 A * | 3/1968 | Garretson et al. ............ 424/119 |
| 4,118,523 A * | 10/1978 | Bingham et al. ............... 438/667 |
| 5,376,584 A | 12/1994 | Agarwala |
| 5,480,835 A * | 1/1996 | Carney et al. .................. 438/614 |
| 5,578,874 A | 11/1996 | Kurogi et al. |
| 5,699,611 A | 12/1997 | Kurogi et al. |
| 5,730,932 A | 3/1998 | Sarkhel et al. |
| 5,744,752 A | 4/1998 | McHerron et al. |
| 5,804,880 A | 9/1998 | Mathew |
| 5,926,731 A * | 7/1999 | Coapman et al. ............. 438/613 |
| 6,015,505 A * | 1/2000 | David et al. .................. 252/79.2 |
| 6,046,074 A | 4/2000 | McHerron et al. |
| 6,111,321 A | 8/2000 | Agarwala |
| 6,297,072 B1 | 10/2001 | Tilmans et al. |
| 6,300,250 B1 * | 10/2001 | Tsai ............................... 438/694 |
| 6,362,435 B1 | 3/2002 | Downey et al. |
| 6,409,073 B1 | 6/2002 | Kaskoun et al. |
| 6,639,314 B2 * | 10/2003 | Boettcher et al. ............. 257/736 |
| 6,660,625 B2 * | 12/2003 | Lee et al. ...................... 438/613 |

(Continued)

FOREIGN PATENT DOCUMENTS

EP             0 951 068 A1    10/1999

(Continued)

OTHER PUBLICATIONS

Lau, Flip Chip Technologies, McGraw-Hill, 1996, p. 127-128.*

(Continued)

*Primary Examiner* — David Zarneke
(74) *Attorney, Agent, or Firm* — Knobbe Martens Olson & Bear LLP (57) ABSTRACT

The present invention is related to a method for providing solder material on a predetermined area on a substrate. In various embodiments, the solder material is deposited on a wetting layer which lies within an area on a substrate having a confinement layer. Further a packaging method and package are disclosed.

26 Claims, 7 Drawing Sheets

U.S. PATENT DOCUMENTS

| | | | |
|---|---|---|---|
| 6,716,736 B2 * | 4/2004 | Chen et al. | 438/612 |
| 6,762,503 B2 * | 7/2004 | Lee | 257/781 |
| 6,852,621 B2 * | 2/2005 | Hanaoka et al. | 438/638 |
| 7,345,358 B2 * | 3/2008 | Akram | 257/673 |
| 2002/0000649 A1 | 1/2002 | Tilmans et al. | |
| 2002/0047217 A1 * | 4/2002 | Zakel et al. | 257/781 |
| 2002/0086144 A1 | 7/2002 | Honda et al. | |
| 2005/0013978 A1 | 1/2005 | Honda et al. | |

FOREIGN PATENT DOCUMENTS

| | | |
|---|---|---|
| JP | 02278743 | 11/1990 |

OTHER PUBLICATIONS

European Search Report of European Application No. EP 04 44 7054.
European Search Report dated Jul. 29, 2005 for European Application No. 05447044.8.

* cited by examiner

METHOD FOR DEPOSITING A SOLDER MATERIAL ON A SUBSTRATE

RELATED APPLICATIONS

This application claims priority to U.S. Provisional Application No. 60/549,216, filed on Mar. 1, 2004, which is hereby incorporated by reference in its entirety.

FIELD OF THE INVENTION

The present invention relates to the field of 2D and 3D hybrid integration and sealing of micro and nano electronic devices such as, for instance, sensors and Micro Electromechanical Systems (MEMS). More generally it relates to a method for depositing a solder material on a substrate in the form of a predetermined pattern, which can extend 2-dimensionally (2D-in plane) or 3-dimensionally (3D).

BACKGROUND

State of the art methods for depositing a solder material on a substrate in the form of a predetermined pattern are for instance (electrical) plating, stencil printing or thermal evaporation.

Figure 1:
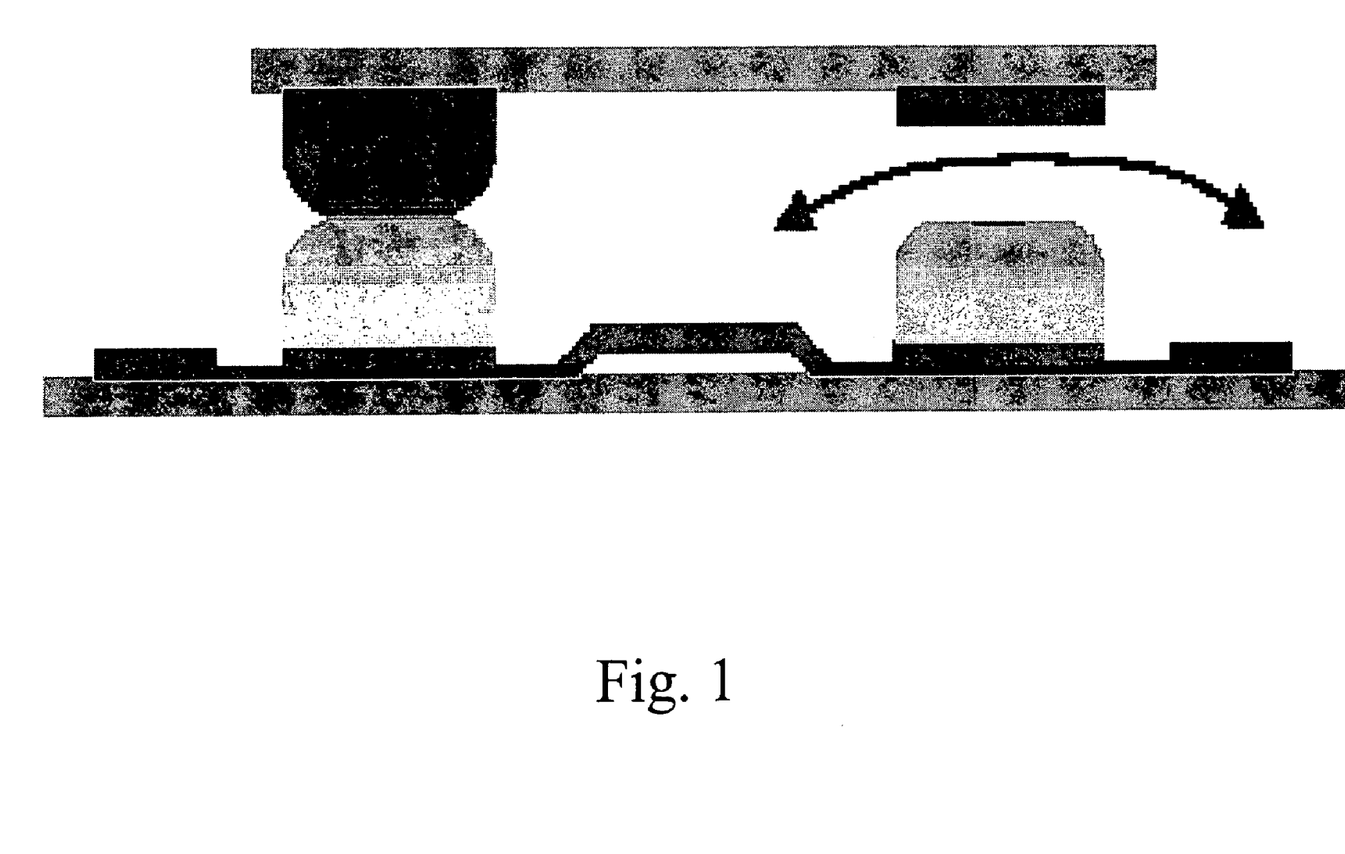
FIG. 1 represents the principle of sealing by indent reflow (cross-section). The cavity can be (hermetically) sealed by the re-flow after it has been evacuated/degassed via the small indent (nozzle) on the right.

Problems arise if a large variety of geometrical shapes and areas on the substrate require deposition of the solder material. This is typically the case in (hermetic) sealing-ring packages (see FIG. 1) that require a wide rim of solder material for mechanical stability and a small nozzle at one point of the rim to allow degassing or evacuation of the cavity. The nozzle can be realized by a small indent of the rim that is closed by a subsequent reflow of the solder (so-called indent re-flow sealing, see for instance in U.S. Pat. No. 6,297,072, entitled METHOD OF FABRICATION OF A MICROSTRUCTURE HAVING AN INTERNAL CAVITY, issued on Oct. 2, 2001, which is incorporated by reference in its entirety).

The problems stem from the non-uniform deposition of the solder material. Such non-uniformities introduce deviations from parallelism and impede the soldering process. The cause of this non-uniformity is two-fold:
1. Deposition by electro-plating (Sn/Pb-alloys and In) suffers from electric field-line crowding (i.e. current crowding) at edges. The deposition rates are therefore different for different geometries. If different shapes or sizes of the deposition areas are present on the same substrate there will be a local variation of the amount of deposited material.
2. As for evaporated material, small structures are difficult to define with the thick resists that are required for the lift-off of the thick soldering metal. In particular small structures of different sizes on the same substrate are difficult to define. The extreme case can be that small structures are not fully developed (they remain open).

Different geometries and sizes of solder areas are ubiquitous in wafer level packaging because various kinds of devices may be manufactured on a single wafer. Non-uniformities of the solder deposition impede further miniaturization of this packaging technique.

It is therefore desirable to find a method, which permits an application of the solder so as to adapt for the here mentioned non-uniformities. It would be even more preferable to have a method that can be used to provide the solder on locations on the substrate that are out of reach of the present solder deposition-techniques (electro-plating and thermal evaporation), i.e. into pitches and via-holes.

Typical solder materials today are for instance Sn/Pb. The use of Pb will be banned by law, so new alternatives are sought; these alternatives should preferably have good properties and/or should allow methods such that hermetic sealing is possible and a stable bond is formed (e.g. high shear force).

Embodiments of the present invention aim to provide a method, which permits a uniform distribution of the solder. It is a further aim of certain embodiments to provide a method which allows distribution of the solder to locations on the substrate/device that are out of reach of the present solder deposition-techniques (electroplating and thermal evaporation), e.g. into pitches and via-holes, or under bridge-like structures.

SUMMARY OF CERTAIN INVENTIVE ASPECTS

Certain embodiments of the present invention are related to a method such as described in appended claims 1 to 26. This method allows the distribution of the solder to locations on the substrate/device that are out of reach of the present solder deposition-techniques (electro-plating and thermal evaporation), e.g. into pitches and via-holes, or under bridge-like structures.

In certain embodiments, the reflowed layer of solder material has a uniform thickness, which is advantageous for instance in packaging applications.

A property of the method according to certain embodiments is such that the first area, the second area and layer thicknesses of the wetting layer and if present barrier layer, are chosen such that the repelling force between the reflow material and the confinement layer is big enough such that the reflow material does not leave the second area during the reflow step.

In certain embodiments of the present invention the reflow material is partly flowing under at least part of a bridge-like or overhanging structure during the reflow step. This is an advantage compared to state of the art solder deposition techniques. An example is for instance the production of T-stack, comprising a confinement layer, wetting layer and, advantageously, a barrier layer, after which for instance a cantilever is provided—placed or produced above at least part of this pattern. The present invention allows then, contrary to the prior art, to provide a layer of solder material under this cantilever structure. Moreover the reflow material is typically conductive and this technique can thus be used for contacting under a bridge-like structure.

In certain embodiments the reflow material fills through holes or vias, possibly connected to internal cavities, during the reflow step. In further embodiments the reflow material flows towards the other side of the substrate, after which a second side of the substrate is at least partially covered with solder material.

In certain embodiments, the method is compatible and can be used with an indent reflow sealing technique (as discussed in U.S. Pat. No. 6,297,072), as described in claims 25 to 27 as originally filed. The method according to such embodiments can further comprise the formation of an indent in the first or the second reflow layer before the flip-chip step.

Certain embodiments relate to a package, which can be applied in all fields such as for instance, but not limited to, MEMS packaging or sensor packaging (e.g. Infrared Sensors).

SHORT DESCRIPTION OF THE DRAWINGS

FIG. 5A to FIG. 5M illustrate a process flow according to an embodiment the present invention.

DETAILED DESCRIPTION OF CERTAIN INVENTIVE EMBODIMENTS

A method for producing a distribution of a solder with uniform thickness is disclosed. The method allows distributing the solder to locations on the substrate/device that are out of reach of the present solder deposition-techniques (electroplating and thermal evaporation), i.e. into pitches and via-holes. In various embodiments the method makes use of indium as a solder material, although in other embodiments, another material or alloy having appropriate properties can be used.

Figure 2:
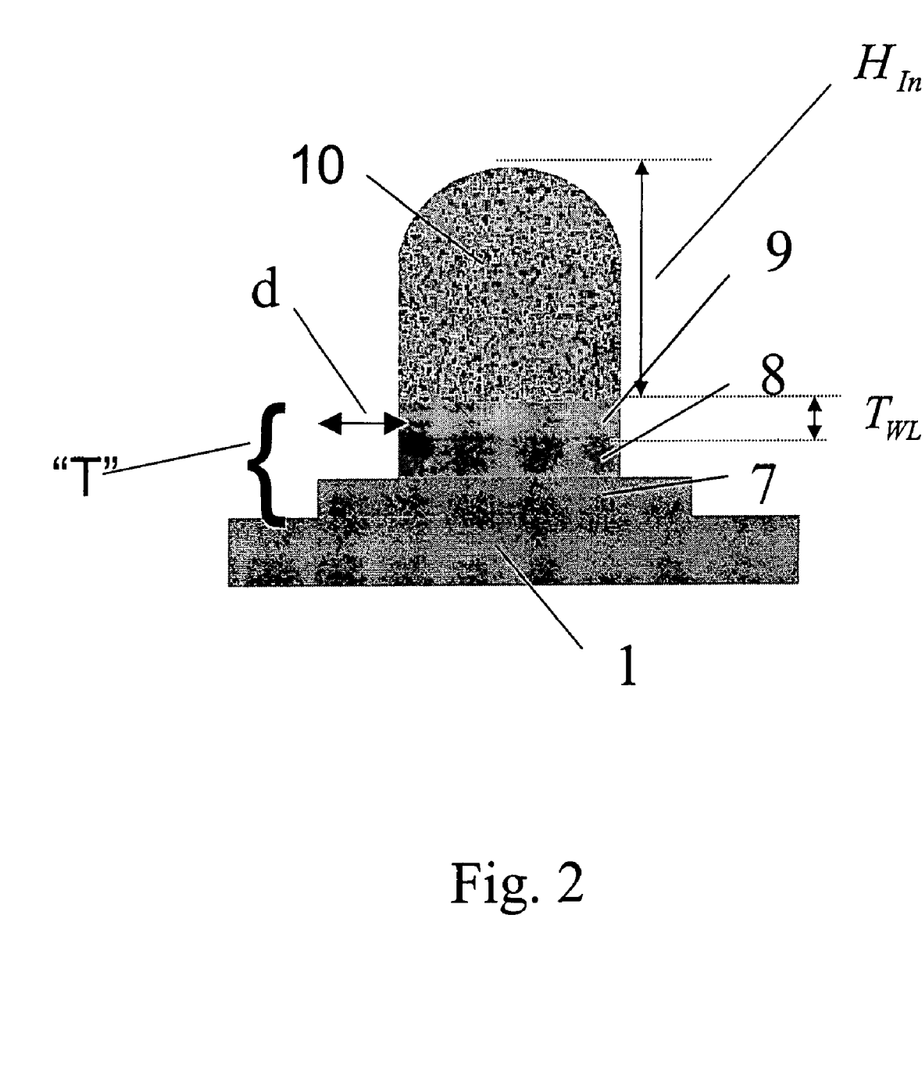
FIG. 2 represents the fluxless guided-flow metallization stack. The T-stack acts like a railway or guiding path confining the liquid indium to the wettable metal areas.
Figure 3:
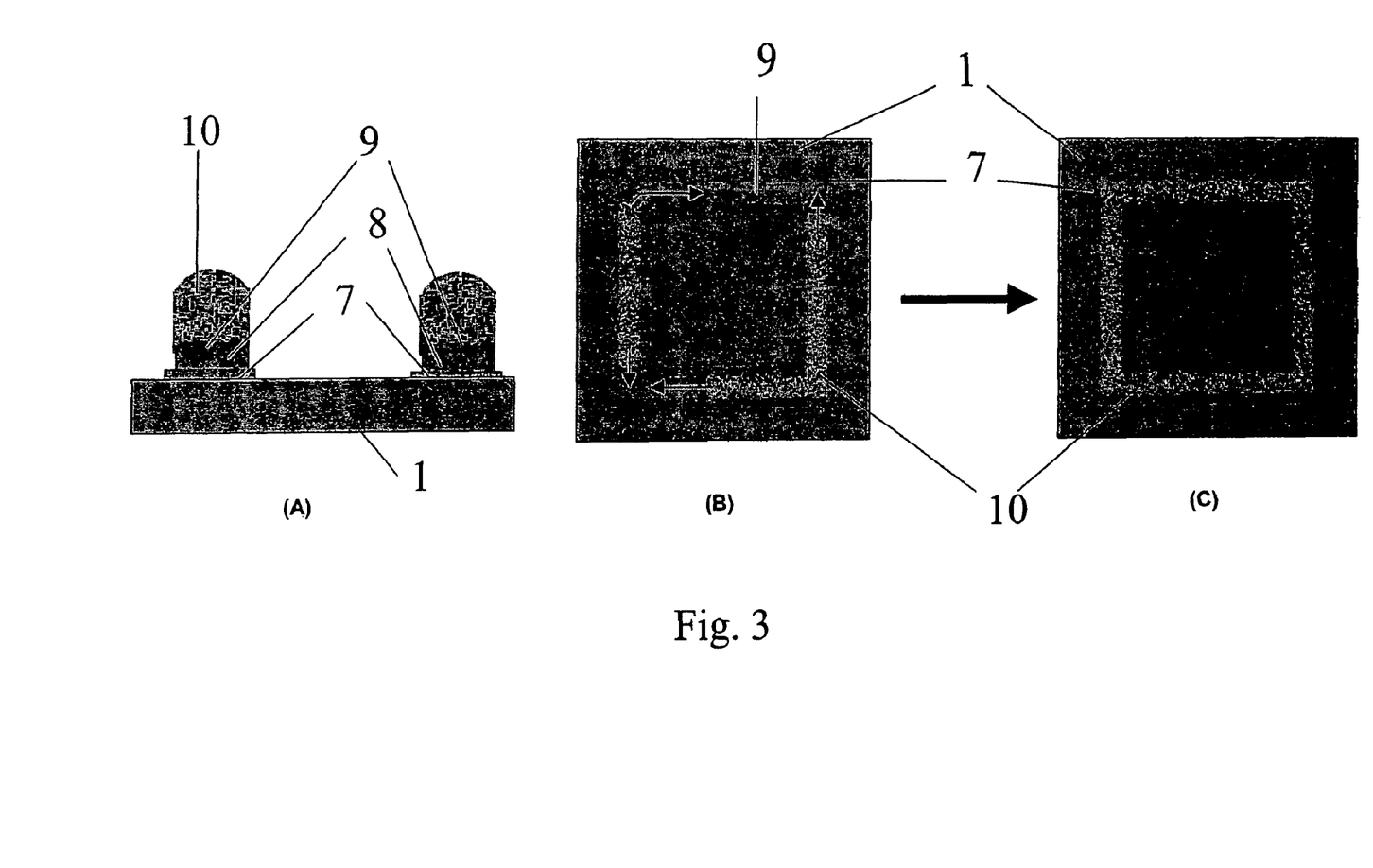
FIG. 3 represents the adaptive indium distribution by fluxless guided-flow. Indium is non-uniformly distributed on the sealing rim (A), as shown in the drawing (B). After a re-flow step at T>about 160° C., the indium is distributed uniformly on the rim (C).

The method is based on the reflow properties of indium in combination with the ability to deposit indium on very fine structures. The concept is depicted in FIG. 2 and FIG. 3.

According to various embodiments of the invention, the indium is deposited through the following process steps:
- a confinement layer 7 is produced, extending on a first area on the substrate's surface 1. The confinement layer repels the indium. The term 'extending on' is meant to describe the situation wherein the orthogonal projection of the layer's in-plane borders on the substrate substantially corresponds to the area.
- a wetting layer 9 is produced, extending on a second area lying within the first area. The wetting layer attracts the indium, in order to facilitate the flow. The wetting layer is produced above the confinement layer, and preferably but not necessarily in direct contact with the confinement layer. A barrier layer may be present between the two (see next paragraph).
- on the wetting layer, the indium 10 is deposited and subsequently reflowed to cover the wetting layer, thus forming a solder layer extending on said wetting layer.

Optionally, lying within the first area, a barrier layer 8 is provided on the confinement layer to prevent diffusion of the indium into the substrate. In this case, the wetting layer is produced on the barrier layer. The barrier layer's surface is preferably larger than the wetting layer's surface.

According to the preferred embodiment, first and second areas are such that the confinement and wetting layer (and possibly the barrier layer) form an 'inverted T-stack'.

In other words, the confinement layer 7 forms a track with a given width, while the wetting layer 9 equally forms a track with a width smaller than the confinement layer's width.

Preferably, the second area is distributed laterally symmetrical with respect to the first area, characterized by a distance of non-overlap d (see FIG. 2). In other words, both tracks have the same longitudinal symmetry line, so that there is a constant distance of non-overlap d on both sides of that symmetry line.

During the re-flow step the indium is melted and distributed over the guiding metal track. The T-metal stack, defining the guiding metal track, permits the indium to flow at elevated temperatures, but also confines the flowing indium to prevent liquid metal spilling on the surface of the substrate. The T-structure allows for a larger repelling force, compared to the case wherein the confinement layer and the wetting layer cover the same area. This property is particularly important for silicon and glass/quartz substrates since indium has a strong affinity to silicon and glass.

Possible typical advantageous dimensions and materials of the T-stack are provided in the following table. Any combination of wettable material and barrier material is possible. The combinations Au/Ni and Au/Pt are preferred. Advantageously the barrier layer is present, but combinations without the barrier layer are not excluded; though the latter provide a lower long-term stability.

TABLE 1

|  | Materials | Thickness (typical) |
|---|---|---|
| Wettable metal | Au, Cu | 50-250 nm (see below, $T_{WL}$) |
| Barrier metal | Ni, Pt | 100-300 nm, e.g. 200 nm |
| Confinement metal | $Ti_xW_{1-x}$ (x = 5%-100%) | 10-30 nm |

As a rule of thumb, the minimum distance of non-overlap (d) of the wettable and the confinement metal can be advantageously chosen to be 1 μm for a resulting indium thickness $H_{In}$ (after reflow) smaller than 10 μm, with an additional safety margin of 1 μm per 10 μm additional indium started (i.e. d=2 μm for an indium thickness $H_{In}$ between 10 & 20 μm).

In many embodiments, the thickness of the wetting layer must not exceed a critical thickness $H_{WM}$ given by the formation of the first intermetallic alloy between indium and the wettable metal. The nature of this first intermetallic alloy depends on the metals used for the wettable layer and the solder layer. The question of whether or not this alloy is formed depends on the thickness of the wettable layer, in such a way that the alloy is formed when the thickness of the wettable layer exceeds a critical value. This critical thickness $H_{WM}$ can be calculated according to the following equation.

$$H_{WM} = H_{In} \cdot \frac{1 - In\ \%}{\rho_{WM} / \rho_{In}}$$

In this equation In % refers to the indium weight-percentage of the first intermetallic alloy, $H_{In}$ to the height of the deposited indium and $\rho_{WM}$ and $\rho_{In}$ to the densities of the wettable metal and of indium (7.3 g/cm³), respectively.

The absence of the first intermetallic alloy guarantees a long-term stability of the metal stack UBM (Under Bump Metallisation)/indium and thus of the (sealed) package and is believed to contribute to the high resulting shear force (experimental results are disclosed further in the text).

For the example of the wettable metal gold the first intermetallic is $AuIn_2$ formed at an indium weight-percentage of 55%. A calculation with 5 μm indium leads to 850 nm critical thickness of gold, i.e. the total thickness of deposited gold should be substantially below this value. As a safety margin a factor 2 is advised, leading to a total gold thickness of about 400 nm.

The re-flow conditions are set by the thermal conductivity of the substrate. In many embodiments, the temperature should exceed 160° C., and typically it would be between 180-280° C. The re-flow should be conducted in an environment of forming gas, which avoids the oxidation of the indium (typically a mixture of $N_2$ and $H_2$; advantageously the concentration of $H_2$ is larger than 2% and smaller than about 5%). Care has to be taken that no indium oxide is formed prior to the re-flow. This can be avoided by depositing a photo resist layer on the reflow layer, which is then stripped just before the reflow step.

Figure 4:
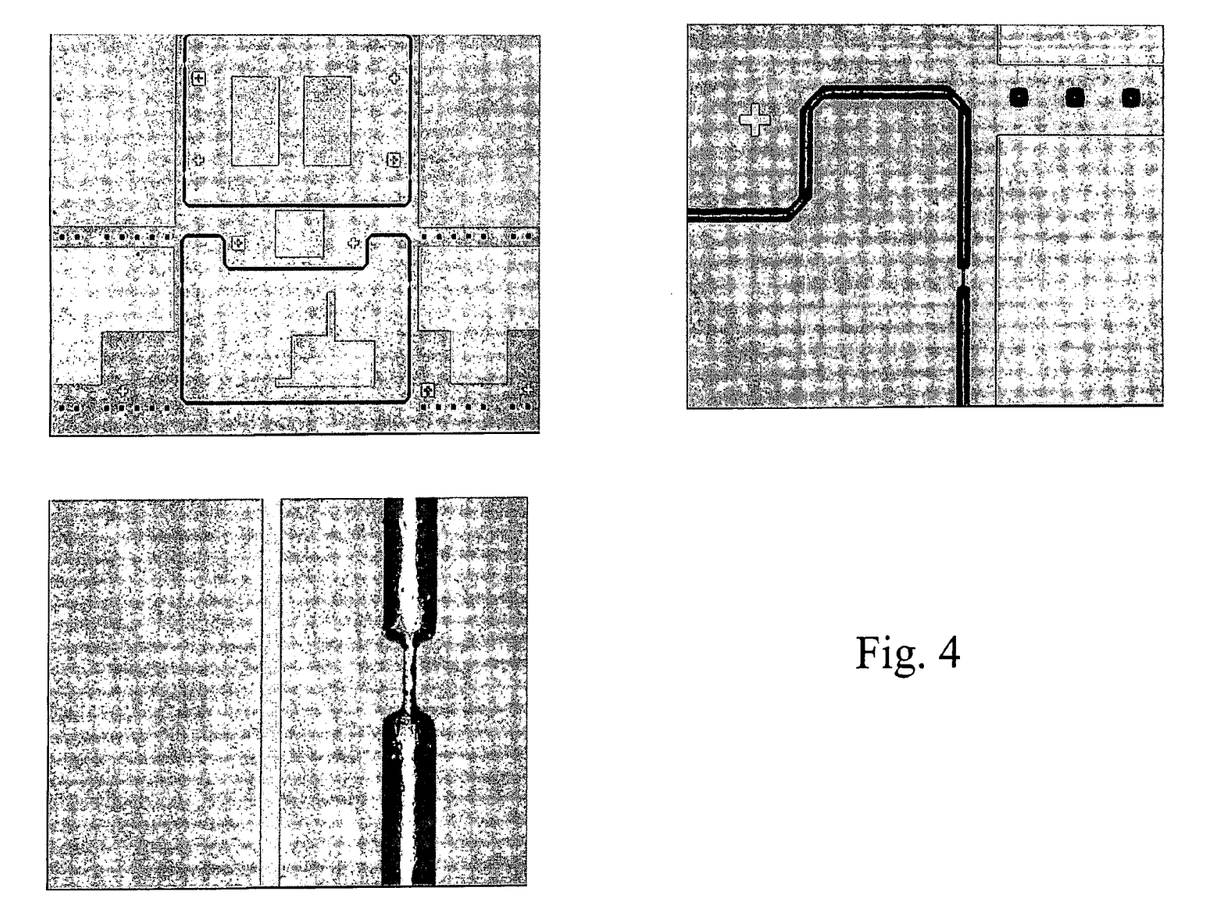
FIG. 4 represents the guided re-flow of indium for indent re-flow sealing application. The width of the indent is about 10 micron while the rest of the metal has a width of about 80 micron. The indium is well distributed all over the structure and has a uniform thickness. (C) is a zoom picture of (B), which is a zoom picture of (A).

The method according to certain embodiments is particularly suited for hermetic packaging by indent re-flow sealing and for zero-level packaging. There are major advantages compared to other technologies like BCB (Benzo Cyclo Butene)-based sealing and Sn/Pb based sealing:

- smaller dimensions can be achieved (because fine dimensions can be manufactured for the T-stack). The indium deposition doesn't need to happen on very small structures as for instance a 10 μm wide or smaller pattern; they can be performed on a pattern of for instance 80 μm wide or bigger (see also further); during a reflow step the indium will flow over the whole UBM pattern, which can comprise a narrower part or sub feature with much smaller widths (for instance 10 μm or smaller, see FIG. 4). The indium can be deposited on only part of the wetting layer, and the relative size of this part is not relevant. It should further also be understood that enough indium needs to be present on this 'only part' of the wetting layer, in order to be able to flow over the whole wetting pattern. An indicative parameter can be the fraction $$F = V_{In}/S_{WM} = \frac{\text{Volume Indium (deposited on 'only part' of the wetting layer)}}{\text{Surface wetting layer}};$$

preferably the thickness of the indium after reflow should be higher than 50 nm, even more preferably higher than 100 nm to guarantee a good reflow process which results in a homogeneously thick indium layer which covers the whole wetting layer. This means that preferably $F>0.05$. Even more preferably $F>0.1$.
- according to certain embodiments the indium doesn't have to be applied over the finally required region.
- the out-gas rate of indium is much lower than BCB or plastics, which typically need solvents before application; these solvents are never completely removed in typical processes.
- the sealing material is non-hygroscopic (e.g. doesn't absorb water) and conductive (which is not the case for instance BCB).
- indium forms metallic joints already at room temperature and is soft (this eases parallelism during the bonding process because flip-chip tools usually exhibit a worse parallelism at higher pressure)
- the re-flow temperature is lower than for Sn/Pb-alloys.

In a further embodiment the ability to feature 3D integration is disclosed, i.e. an interconnect through the wafer through a via and the flow of indium through micro-machined ditches etc. While during the reflow step, the solder/indium material flows along the pattern defined by the UBM stack, it can be guided towards a through hole or via.

According to this embodiment, in addition to the process steps described above for the first surface of the substrate, a confinement layer is produced on the opposite (second) surface of the substrate as well, in the same manner as described above, extending on a first area of the second surface. A wetting layer is applied on a second area of the second surface, with possibly a barrier layer between the confinement and the wetting layers.

A hole is produced connecting the second area on the first surface to the second area on the second surface, i.e. the hole is situated between the respective areas. A wetting layer is equally applied to the inside surface of this hole or via, so that this surface is at least partially covered with a wetting layer, and preferably completely covered. The presence of a barrier material on the inside surface of the hole can be advantageous but is not necessary. The presence of a confinement layer on the inside of the hole is possible but not necessary since the confinement is performed by the through hole or via itself. It is to be noted that the hole is not necessarily formed after the confinement and wetting layers have been produced on both sides of the substrate. Typically, the hole is produced before applying these layers.

Indium is then deposited on a part of the wetting layer of the first surface, followed by a reflow step, whereby indium flows over the wetting layer of the first surface, through the hole, and over the wetting layer of the second surface, until the wetting layers on both surfaces are covered with a layer of indium, extending on the wetting layers.

The wetting layer on the second surface and thus the resulting indium layer on the second surface, can serve as a contacting area towards underlying substrates, chips, or any electronic structures known in the art which need to be electrically contacted or interconnected. They can be designed to provide well-positioned contact-pads on the second surface of the substrate, which are connected to the front side, which can comprise electrical elements. In the same way the wetting layer on the first surface and thus the resulting indium layer on the first surface can comprise patterns which can serve as interconnect patterns.

In certain embodiments according to the present invention the indium reflowed layer forms interconnects from a first surface of the wafer to a second surface of the wafer.

An additional driver for the through hole filling can be capillary force.

In a further embodiment internal cavities, which are connected to a (through) hole can be filled during the reflow step.

The via or through hole is attached on both sides of the wafer to another UBM stack, such that indium that passes through the wafer keeps on reflowing on the other side of the substrate.

Figure 7A:
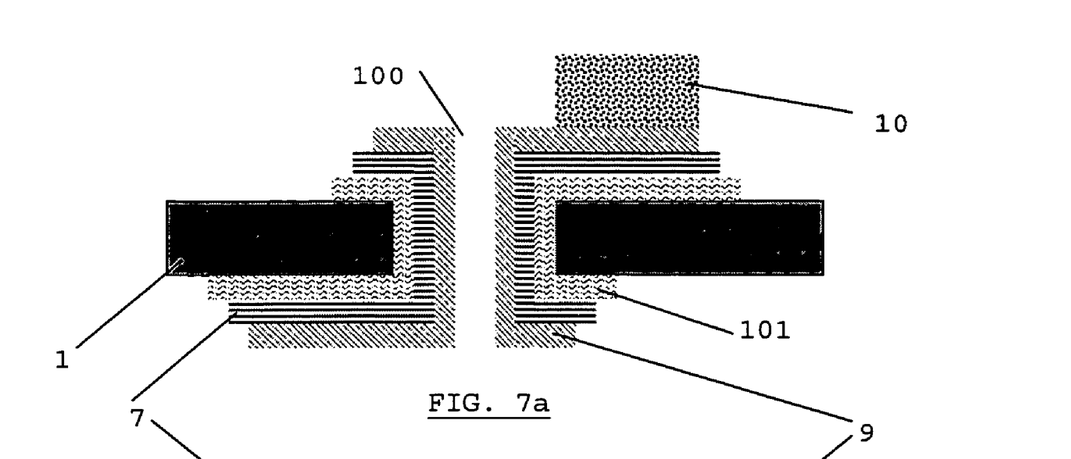
FIG. 7A and FIG. 7B illustrate an embodiment wherein two opposite surfaces of a substrate are covered with indium, reflowed from one surface to the other through a hole in the substrate.
Figure 7B:
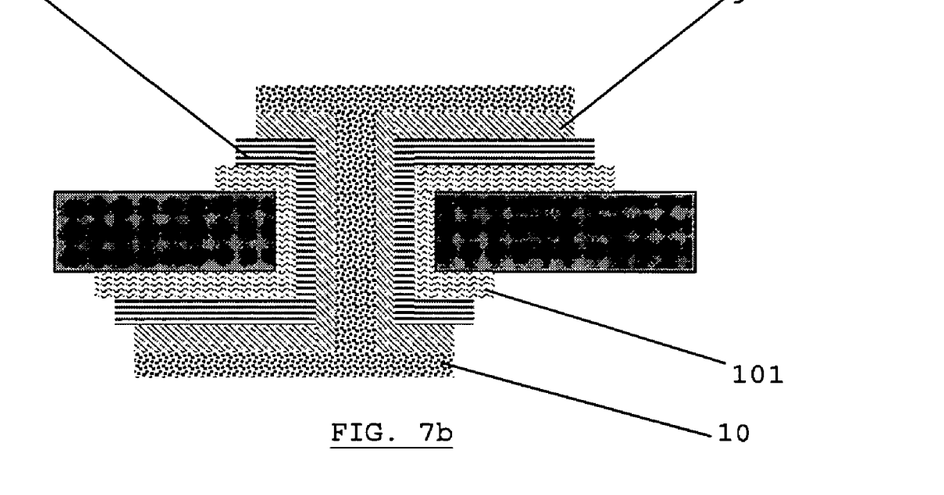

This is illustrated in FIG. 7. In the embodiment shown, the hole 100 is covered on its inside surface by the confinement layer 7, and the wetting layer 9. The indium 10 is shown before (FIG. 7a) and after reflow (FIG. 7b). The hole 100 forms a connection between the wetting layers on both sides of the substrate. Confinement layers are equally present on both sides, so that the indium covers the wetting layers on both sides of the substrate, after the reflow step. In the case of FIG. 7, an electrically insulating layer 101 is present under the confinement layer. In the embodiment shown in FIG. 7, the hole was produced before applying the insulating layer, confinement and wetting layers. That way, these layers are all present on the inside surface of the hole. As stated above, it is only the wetting layer which is necessary, according to certain embodiments of the present invention, on at least a part of this inside surface.

According to the preferred embodiment, the confinement layer, possible barrier layer and wetting layer on the second surface, equally form a T-stack, as was described for the layers on the first surface. All the embodiments described above in terms of materials and layer thicknesses etc, can be applied as well to the layers on the second surface.

There are alternative techniques for conductive via fillings like poly-silicon. However, these techniques require higher temperatures (~630° C.) and are therefore not suitable as silicon back-end processes since standard CMOS can only resist to temperatures up to maximum 450° C. or for other types of substrates like for instance polymer or organic substrates which cannot tolerate such high temperatures.

Other embodiments of the invention relate to a method of producing a package through wafer level sealing, wherein the method described above is applied on at least one substrate, to produce a pattern of reflowed indium on the first substrate. On a second substrate, e.g. a MEMS substrate, the same method is preferably applied to obtain a similar pattern. After that, the second substrate is aligned and positioned onto the first by a flip-chip step, and the sealing is obtained by an additional reflow step, thereby joining the two indium layers effectively together.

Alternatively, a confinement layer and a wetting layer are applied to the second substrate, but no indium layer is deposited and reflowed on the second substrate. In that case, the indium layer on the first substrate alone makes sure that the sealing is obtained. Also in this case, after joining, a second reflow step is performed.

An embodiment of the invention is thus related to a package defined by a first substrate, a sidewall and a second substrate forming a top cover or cap, said sidewall comprising indium, said sidewall comprising:
  attached to each substrate respectively, a confinement layer forming a track with a given width,
  above each confinement layer, as seen from the respective substrate, a wetting layer forming a track with a width smaller than the respective confinement layer's width.

Each confinement layer and each wetting layer which is present above said confinement layer preferably have the same longitudinal symmetry line. A barrier layer may be present between at least one confinement layer and the wetting layer present above said confinement layer.

For the package according to various embodiments of the invention, the confinement layer, wetting layer and reflowed indium layer(s) may have the characteristics as described above with respect to the method of the invention, in terms of materials, layer thicknesses etc.

Experimental Results

First tests of the re-flow capabilities of indium have been performed on silicon wafers. The T-stack in this case was $Ti_{5\%}W_{95\%}$/Au (10/200 nm), i.e. without diffusion barrier. The re-flow was conducted in a forming gas rapid anneal oven (4 min, 280° C.), see FIG. 5.

Figure 5:
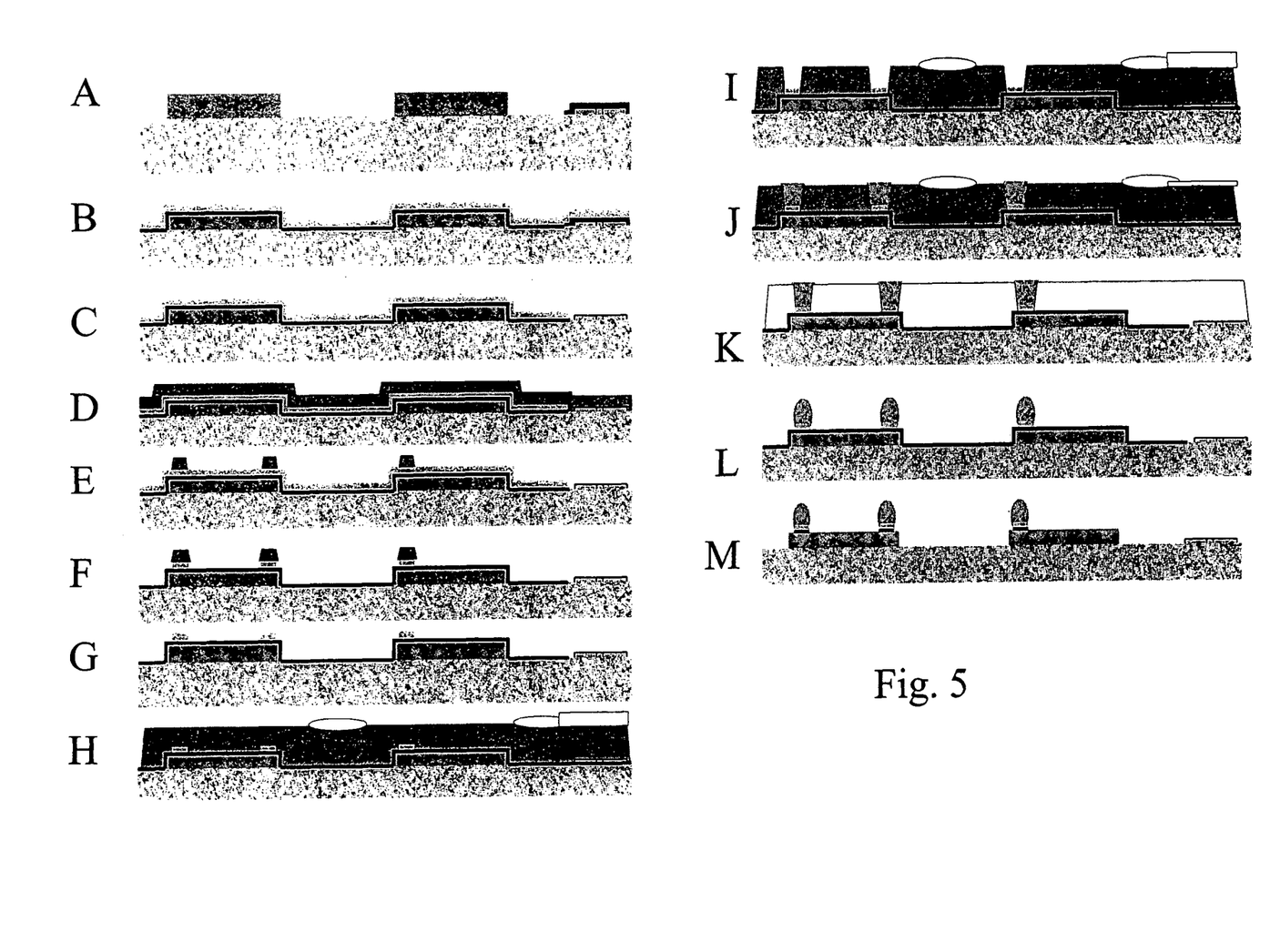

A typical process flow is described below with reference to FIG. 5. The different steps and parameters, which describe these steps, correspond to a specific embodiment of the present invention. It should be understood that a person skilled in the art could vary various steps or parameters without changing the general idea, which is described in the claims.

A. A wafer e.g. Si wafer, with a dielectric layer is provided (e.g. a 1.5 μm Si-oxide). Alignment crosses are covered with vacuum tape.

Under Bump Metalisation (UBM)

B. A layer of 30 nm of TiW [typically between 25 and 35 nm] and 500 nm of Au are sputtered.

C. The vacuum tape is removed from the wafer; the alignment crosses are visible now.

D. A positive resist is spin coated on the wafer. The wafer is baked during one minute on a hotplate of 120° C. After baking, the resist thickness is about 2.7 μm.

E. The resist is exposed in a contact mask aligner in hard contact mode. A UBM negative mask was applied. To develop the resist, a solution of diluted TMHA (Tetramethylammonium Hydroxide)-based photo-resist developer is used. The exposure time/development time can be reduced to compensate the effects of a gold under etch (see next step).

F. A KI/I2/H2O solution is used for the gold etch. The etch time is a function of the thickness of the gold layer. The wafer is rinsed with water immediately after etching. The selectivity compared to TiW is good. A new UBM negative mask forms new alignment crosses for the plating mask.

G. The resist is stripped with for instance acetone to remove the major part of the resist, followed by hot acetone (50° C.) to remove the rests and finally IPA (IsoPropyl Alcohol) to avoid traces when drying the wafer.

Indium Plating

H. A positive plating resist is spin coated on the wafer. The resist excess at the border of the wafer is removed (edge bead removal). The wafer is baked during 60 minutes in 90° C. oven. After baking, the resist thickness is about 9 μm.

I. The resist is exposed in a mask aligner in hard contact mode. The alignment crosses are defined by the previous—UBM—mask. To develop the resist, a solution of diluted TMAH based photo-resist developer is used. Extra attention is drawn to the alignment: to achieve a good plating the resist must cover the TiW layer, no TiW should be exposed to the plating solution.

J. The backside of the wafer is coated with a positive resist to protect this side of the wafer from being plated. The wafer is baked during 15 minutes in a 95° C. oven. Before plating, an oxygen plasma is applied to the sample in a RIE (Reactive Ion Etching) plasma etch system. Plating is done in an indium plating solution. Plating thickness is about 8 to 9 μm.

K. The resist (coated on the backside of the wafer) is stripped with acetone to remove the major part of the resist, followed by hot acetone (50° C.) to remove the rest and finally IPA (IsoPropyl Alcohol) to avoid traces when drying the wafer.

Indium Reflow

L. The wafer is heated up to 280° C. during 4 minutes in a reflow oven. The previous step and the reflow are done directly after the plating to avoid oxidation of the indium metal surface.

M. The TiW layer is etched in a $H_2O_2$, 40% solution. The etch rate is about 0.75 μm/min. Total etch time is about 40 minutes.

N. The wafer is covered with resist to protect the indium from being oxidised (not depicted in FIG. 5).

O. Before the flip chip of the device, the resist is stripped. A $CF_4$-plasma (alternatively for instance a $SF_6$ plasma) is given to remove possible leftovers of the resist and to avoid oxidation of the indium (not depicted in FIG. 5).

P. Flip chip (not depicted in FIG. 5) of the MEMS wafer, whereby in preferred embodiments also a similar UBM stack is applied on the MEMS wafer before the flip chip, following the same patterns. Hereby an UBM/In/UBM layer structure can be acquired. It is not necessary that an indium layer is present on both wafers. This means that for the production of a package, the steps of the method of claim 1 can be applied to one wafer, while on the other, only a confinement layer and a wetting layer are applied, with the same pattern of the corresponding layers on the other wafer.

Second Indium Reflow

Q. After flip chip a second reflow is done to create an intermetallic of the indium with the top metal layer or UBM stack of the MEMS wafer. This will also improve the bonding strength. The sample is heated up to 280° C. during 4.5 minutes in forming gas atmosphere. This step can be combined with an Indent Reflow Sealing technique to control the atmosphere in the package.

Figure 6:
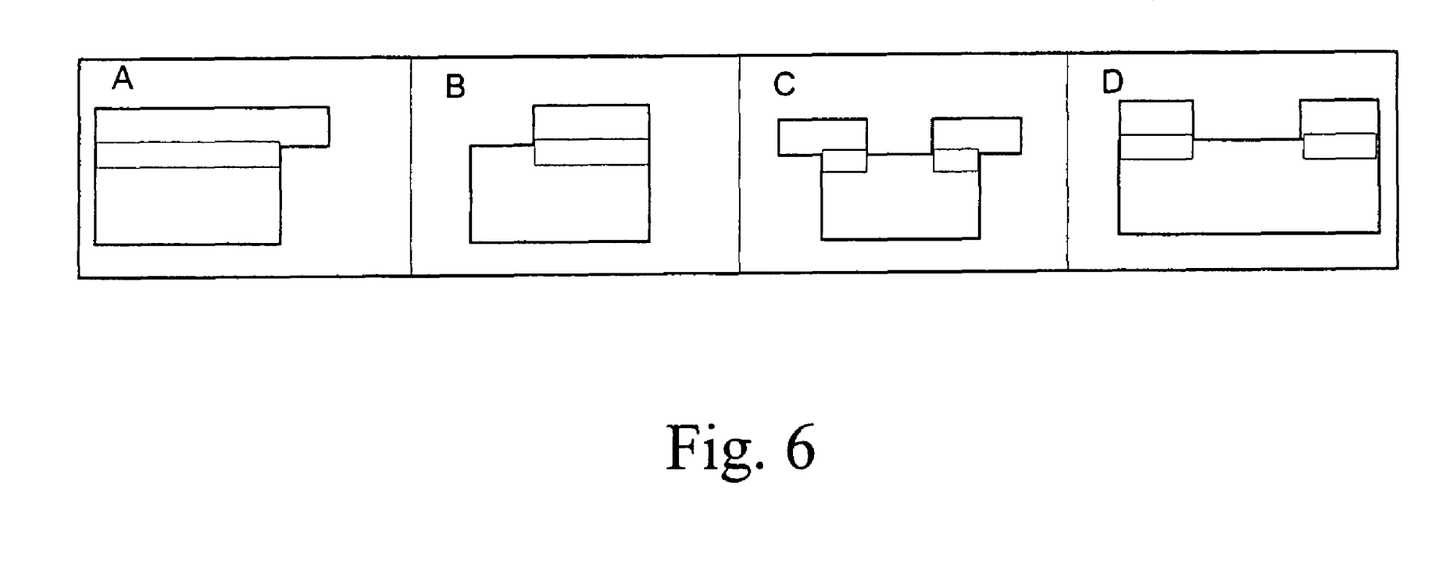
FIG. 6 represents some of the sealing patterns for which an embodiment of the present invention has been tested.

Different shapes of rims have been realized (some are depicted in FIG. 6), using the above described technology. The rims have been flipped and underwent an X-ray test, a leak test & a shear test. The X-ray test showed the presence of the first intermetallic alloy.

Gross Leak Test:

Gross leak tests are performed in two baths with liquids. The liquids have different boiling temperatures. The vacuum package is kept in the bath with the liquid with the lower boiling temperature for several hours. Then the sample is moved to the bath with the higher boiling temperature. If there is a gross leak, liquid with the lower boiling temperature is inside the package and starts to boil. This becomes visible by forming of bubbles (see: MIL-STD-202G, 8 Feb. 2002).

Fine Leak Test:

For the fine leak test a small hole is drilled in the package (1 mm$^2$). The package is pumped down to high vacuum through this hole. The vacuum pump is connected to a helium leak test system. From the other side helium is sprayed against the package. If the package is leaky a helium signal can be detected at the leak detector.

Hermeticity Tests & Results:

TABLE 2

| Fine Leak | | | Gross leak | |
| --- | --- | --- | --- | --- |
| Time in He (h) | Pressure (bar) | Fine leak (mbar l/sec) | Time in FC84 (h) | T of FC40 (C) |
| 95 | 1 bar (no vacuum) | (3 ± 0.1)E−9 | 45.3 | 110 |

No fine leak was measured with the leak detector system.

A gross leak was performed and no gross leak was determined. Time in first fluorined FC84 (3M trademark) was 94 hours 30 min and the temperature of FC40 (3M trademark) was 110° C. (FC84 and FC40 are fluorocarbon liquids).

Shear Tests & Results:

A set of 10 devices flip chip mounted with indium on a 3" wafer. Mounting structures were indium ring-structures, with adhesion areas between 100 and 250 µm$^2$. A shear test was performed.

TABLE 3

| Sample nr | Shear force (gf) |
| --- | --- |
| 1 | 1713.23 |
| 2 | 2048.21 |
| 3 | 1795.57 |
| 4 | 1084.8 |
| 5 | 1766.01 |
| 6 | 841.31 |
| 7 | 1343.42 |

TABLE 3-continued

| Sample nr | Shear force (gf) |
| --- | --- |
| 8 | 1762.14 |
| 9 | 1492.26 |
| 10 | 970.09 |

Shear strengths in the range of about 1 to 2.5 kgf were reached. The shear strength is only indicative, but is very high, i.e. much higher than most standard requirements.

The conclusions from these tests were that indium re-flow sealing, according to the present invention, creates hermetic packages and that it provides for sufficiently large mechanical strength of these packages.

The invention claimed is:

1. A method of providing solder material on a predetermined area on a substrate, comprising:
    providing a substrate;
    producing a confinement layer extending on a first area of a first surface of the substrate, the confinement layer comprising a confinement material, and wherein the confinement material is selected to repel a solder material;
    producing a wetting layer, extending on a second area, the wetting layer comprising a wetting material, the second area lying within the first area, wherein the wetting material is selected to attract the solder material, wherein the confinement layer is located between the wetting layer and the substrate, and wherein the confinement layer forms a track with a given width, while the wetting layer forms a track with a width smaller than the width of the confinement layer;
    depositing the solder material on a part of the wetting layer, wherein the solder material comprises indium; and
    reflowing the solder material until the wetting layer is covered with a layer of the solder material, wherein a repelling force between the confinement layer and the solder material prevents the solder material from leaving the wetting layer during the reflowing process.

2. The method according to claim 1, wherein the confinement layer and the wetting layer have the same longitudinal symmetry line.

3. The method according to claim 1, further comprising producing on the confinement layer a barrier layer extending on a third area lying within the first area, and wherein the wetting layer is produced on the barrier layer, such that the wetting layer and the confinement layer are not in direct physical contact.

4. The method according to claim 1, further comprising:
    producing a confinement layer extending on a first area of a second surface of the substrate, the confinement layer comprising a confinement material, and wherein the confinement material is selected to repel the solder material;
    producing a wetting layer, extending over a second area on the second surface, comprising a wetting material, the second area of the second surface lying within the first area of the second surface, wherein the wetting material is selected to attract the solder material, and wherein the confinement layer is located between the wetting layer and the substrate;
    producing a hole or via through the substrate, connecting the second area of the first surface to the second area of the second surface;

applying a wetting layer on at least a part of the inside surface of the hole or via;

depositing the solder material on a part of the wetting layer present on the first surface, the solder material comprising indium; and reflowing the solder material until the wetting layers on both surfaces are covered with a layer of solder material.

5. The method according to claim 4, further comprising producing a barrier layer on the confinement layer of the second surface, the barrier layer extending on a third area of the second surface, this third area lying within the first area of the second surface, and wherein the wetting layer on the second surface is produced on the barrier layer, such that the wetting layer and the confinement layer on the second surface are not in direct physical contact.

6. The method according to claim 4, wherein the confinement layer of the second surface forms a track with a given width, while the wetting layer of the second surface forms a track with a width smaller than the confinement layer's width.

7. The method according to claim 6, wherein the confinement layer and the wetting layer of the second surface have the same longitudinal symmetry line.

8. The method according to claim 1, further comprising foaming a bridge-like structure on the substrate, and wherein during the reflow step the solder material flows under at least part of the bridge-like structure.

9. The method according to claim 1, wherein the layer of solder material, formed after the reflow step, has a uniform thickness.

10. The method according to claim 2, wherein the difference in width between the confinement layer and the wetting layer equals N μm, where N=2[INT[$H_{In}$/10]+1], $H_{In}$ being the thickness of the resulting indium layer after reflow.

11. The method according to claim 1, wherein the volume of the solder material deposited on the wetting layer is greater than about 0.05 μm multiplied by the surface area of the wetting layer.

12. The method according to claim 1, wherein the volume of the solder material deposited on the wetting layer is greater than about 0.1 μm multiplied by the surface are of the wetting layer.

13. The method according to claim 1, wherein the thickness of the indium layer after reflow is greater than about 50 nm.

14. The method according to claim 1, wherein the wetting material comprises Au or Cu.

15. The method according to claim 1, wherein during the reflow step no intermetallic alloy is formed between the reflow material and the wetting layer.

16. The method according to claim 15, wherein the thickness of the wetting layer $T_{WL}$ is smaller than the critical thickness $$H_{WM} = H_{In} \cdot \frac{1 - In\ \%}{\rho_{WM}/\rho_{In}},$$

wherein In % refers to the indium weight-percentage of the first intermetallic alloy, $H_{In}$ to the height of the deposited indium and $\rho_{WM}$ and $\rho_{In}$ to the densities of the wettable metal and of indium respectively.

17. The method according to claim 1, wherein the wetting layer has a thickness between about 50 nm and about 250 nm.

18. The method according to claim 1, wherein the confinement material comprises $Ti_xW_{1-x}$, wherein x is between about 5% and about 100%.

19. The method according to claim 1, wherein the confinement layer has a thickness between about 10 and about 30 nm.

20. The method according to claim 3, wherein the barrier material comprises Ni or Pt.

21. The method according to claim 3, wherein the barrier layer has a thickness of about 200 nm.

22. The method according to claim 1, wherein the reflow step is performed at a temperature higher than about 160° C.

23. The method according to claim 22, wherein the reflow step is performed at a temperature between about 180° C. and about 280° C.

24. The method according to claim 1, wherein the solder material is repelled by the containment layer.

25. The method according to claim 1, wherein the solder material is not deposited on the containment layer.

26. The method according to claim 1, wherein the solder material is deposited at least two separate locations along the wetting layer track, and wherein reflowing the solder material comprises reflowing the solder material to cover the wetting layer between said at least two separate locations.

* * * * *